(12) United States Patent
Karp et al.

(10) Patent No.: US 8,519,741 B1
(45) Date of Patent: Aug. 27, 2013

(54) OPERATING A PROGRAMMABLE INTEGRATED CIRCUIT WITH FUNCTIONALLY EQUIVALENT CONFIGURATION BITSTREAMS

(75) Inventors: James Karp, Saratoga, CA (US);
Michael J. Hart, Palo Alto, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 13/543,508

(22) Filed: Jul. 6, 2012

(51) Int. Cl.
*H03K 19/173* (2006.01)

(52) U.S. Cl.
USPC ............... 326/41; 326/37; 326/39; 714/725

(58) Field of Classification Search
None
See application file for complete search history.

(56) References Cited

U.S. PATENT DOCUMENTS

| | | | |
|---|---|---|---|
| 5,426,378 A | 6/1995 | Ong | |
| 5,583,450 A | 12/1996 | Trimberger et al. | |
| 5,600,263 A | 2/1997 | Trimberger et al. | |
| 5,629,637 A | 5/1997 | Trimberger et al. | |
| 5,646,545 A | 7/1997 | Trimberger et al. | |
| 5,701,441 A | 12/1997 | Trimberger | |
| 5,761,483 A | 6/1998 | Trimberger | |
| 5,778,439 A | 7/1998 | Trimberger | |
| 5,784,313 A | 7/1998 | Trimberger et al. | |
| 5,825,662 A | 10/1998 | Trimberger | |
| 5,838,954 A | 11/1998 | Trimberger | |
| 5,959,881 A | 9/1999 | Trimberger et al. | |
| 5,978,260 A | 11/1999 | Trimberger et al. | |
| 6,172,521 B1 * | 1/2001 | Motomura | 326/40 |
| 6,263,430 B1 | 7/2001 | Trimberger et al. | |
| 6,480,954 B2 | 11/2002 | Trimberger et al. | |
| 6,748,456 B1 * | 6/2004 | Stanton et al. | 710/1 |
| 6,798,270 B1 * | 9/2004 | Bauer | 327/408 |
| 7,249,010 B1 * | 7/2007 | Sundararajan et al. | 703/21 |
| 7,284,229 B1 | 10/2007 | Trimberger | |
| 7,412,635 B1 | 8/2008 | Trimberger | |
| 7,424,655 B1 | 9/2008 | Trimberger | |
| 7,539,914 B1 * | 5/2009 | Sundararajan et al. | 714/725 |
| 7,555,741 B1 * | 6/2009 | Milton et al. | 716/101 |
| 7,620,863 B1 * | 11/2009 | Trimberger | 714/725 |
| 7,772,093 B2 | 8/2010 | Luo et al. | |
| 7,849,435 B1 | 12/2010 | Trimberger | |
| 8,117,580 B1 | 2/2012 | Trimberger | |

OTHER PUBLICATIONS

Morgan et al., A Comparison of TMR With Alternative Fault-Tolerant Design Techniques for FPGAs, IEEE Transactions on Nuclear Science, vol. 54, No. 6, Dec. 2007.*
Quinn et al., A Review of Xilinx FPGA Architectural Reliability Concerns from Virtex to Virtex-5, IEEE, 2007.*
U.S. Appl. No. 12/141,958, filed Jun. 19, 2008, Trimberger.
U.S. Appl. No. 12/141,959, filed Jun. 19, 2008, Trimberger.

(Continued)

*Primary Examiner* — Shawki Ismail
*Assistant Examiner* — Nelson Correa
(74) *Attorney, Agent, or Firm* — LeRoy D. Maunu; Lois D. Cartier (57) ABSTRACT

Approaches for operating a programmable integrated circuit (IC) are disclosed. One configuration bitstream of two or more configuration bitstreams is selected. Each configuration bitstream implements a functionally equivalent circuit on the programmable IC and programs a respective subset of pass gates of the programmable IC. Each subset of pass gates programmed by the configuration bitstreams is disjoint from each other subset of pass gates. The programmable IC, which is defect-free, is configured with the selected configuration bitstream. The defect-free programmable IC is then operated for a period of time. The selecting, configuring and operating are repeated, and for successive selecting operations, different ones of the configuration bitstreams are selected.

19 Claims, 4 Drawing Sheets

(56) References Cited

OTHER PUBLICATIONS

Ghetti, Andrea, "Gate Oxide Reliability: Physical and Computational Models," *Predictive Simulation of Semiconductor Processing: Status and Challenges*, Jun. 24, 2004, pp. 201-258, Springer-Verlag GmbH, Berlin, Germany.

\* cited by examiner

OPERATING A PROGRAMMABLE INTEGRATED CIRCUIT WITH FUNCTIONALLY EQUIVALENT CONFIGURATION BITSTREAMS

FIELD OF THE INVENTION

One or more embodiments generally relate to operating a programmable integrated circuit (IC) with functionally equivalent configuration bitstreams at different times.

BACKGROUND

Programmable integrated circuits (ICs), such as field programmable gate arrays (FPGAs), are popular in many applications due to their re-programmability. In space applications, such as satellites and unmanned exploration vehicles, the mission may last decades. Thus, the reliability of parts used in the systems is critical.

FPGAs have many pass gates which are used for programmably routing signals of circuit designs. The lifespan of an FPGA may be limited by the expected lifespan of the pass gates. The maker of an FPGA often provides an estimate of the time for which the FGPA is expected to reliably operate, which is limited by the lifespan of the pass gates having a certain gate voltage. One approach for extending the lifetime of a device is to specially design pass gate circuitry to last for the duration of a particular mission. However, custom circuitry may significantly increase the cost and size of the device. Embodiments of the present invention address one or more of these issues.

SUMMARY

In one embodiment, a method of operating a programmable integrated circuit (IC) is provided. The method includes selecting one configuration bitstream of two or more configuration bitstreams. Each configuration bitstream implements a functionally equivalent circuit on the programmable IC and programs a respective subset of pass gates of the programmable IC. Each subset of pass gates programmed by the configuration bitstreams is disjoint from each other subset of pass gates. The programmable IC, which is defect-free, is configured with the selected configuration bitstream. The defect-free programmable IC is then operated for a period of time. The selecting, configuring and operating are repeated, and for successive selecting operations, different ones of the configuration bitstreams are selected.

In another embodiment, a system includes a defect-free programmable integrated circuit (IC) having a configuration port and a plurality of pass gates. A storage device is coupled to the configuration port of the programmable IC and is configured with two or more configuration bitstreams. Each configuration bitstream implements a functionally equivalent circuit on the programmable IC and programs a respective subset of the pass gates. Each respective subset of pass gates is disjoint from each other subset of pass gates. A control circuit is coupled to the storage device and to the programmable IC. The control circuit is configured and arranged to select one of the two or more configuration bitstreams and configure the programmable IC with the one configuration bitstream. The control circuit then operates the defect-free programmable IC for a period of time, and then repeats the selecting, configuring and operating. For successive selecting operations, different ones of the configuration bitstreams are selected.

A method of processing a circuit design is provided in another embodiment. The method includes identifying pass gates in a target programmable integrated circuit (IC). Two or more configuration bitstreams are generated from the circuit design. Each configuration bitstream implements a functionally equivalent circuit on the programmable IC and each configuration bitstream uses a respective subset of the pass gates. Each respective subset of pass gates is disjoint from each other subset of pass gates.

Other embodiments will be recognized from consideration of the Detailed Description and Claims, which follow.

BRIEF DESCRIPTION OF THE DRAWINGS

Various aspects and advantages of the disclosed embodiments will become apparent upon review of the following detailed description and upon reference to the drawings, in which.

DETAILED DESCRIPTION

There are many alternative paths for routing signals through the programmable interconnect of a programmable IC such as an FPGA, and many designs use only a small portion of the pass gates of a programmable IC. The life of a programmable IC may be extended by taking advantage of the availability of alternative paths for routing signals and the unused pass gates. In addition, the performance of a programmable IC may be increased by increasing the operating voltage of a programmable IC, and the increased performance may be achieved without increasing the risk of early failure of the programmable IC.

In one or more embodiments, multiple bitstreams are created. Each bitstream implements a functionally equivalent circuit on the programmable IC and each bitstream uses different ones of the pass gates of the programmable IC. By configuring and operating the programmable IC with different bitstreams at different times, no one of the pass gates is used beyond its period of expected reliability. Thus, the programmable IC may be expected to reliably operate well beyond the rated period. Since the programmable IC is operated at different times while having been configured with different configuration bitstreams, the programmable IC may also be operated at a voltage level that is greater than its rated operating voltage level.

A particular method of operating a programmable IC according to one embodiment includes selecting one configuration bitstream of two or more configuration bitstreams. The configuration bitstreams are functionally equivalent, and each configuration bitstream programs a respective subset of pass gates of the programmable IC. The subsets of pass gates are disjoint from one another. A defect-free programmable IC is configured with the selected configuration bitstream, and the programmable IC is operated for a period of time. The selecting, configuring and operating are repeated, and for successive selecting operations, different ones of the configuration bitstreams are selected.

Figure 1:
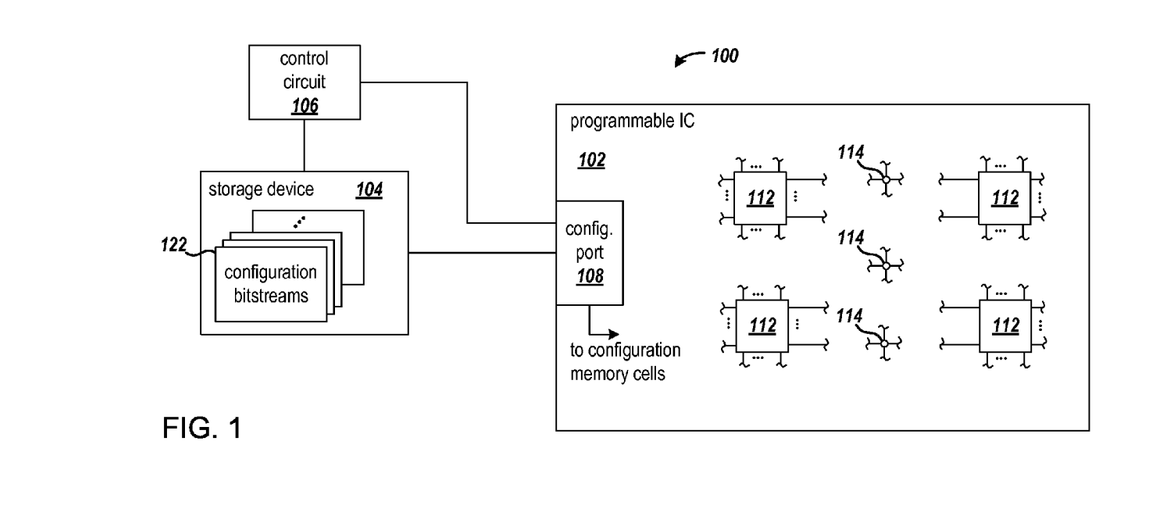
FIG. 1 shows an example system in which multiple, functionally equivalent configuration bitstreams are used to program disjoint subsets of pass gates of the programmable IC.

FIG. 1 shows an example system in which multiple, functionally equivalent configuration bitstreams are used to program disjoint subsets of pass gates of the programmable IC. The system 100 includes a programmable IC 102 that is coupled to a storage device 104, and a control circuit 106 that is also coupled to the storage device and to the programmable IC.

The programmable IC includes a configuration port 108 that is coupled to the configuration memory cells (not shown) of the programmable IC. The states of the configuration memory cells control the functions that are implemented by the tiles 112 of the programmable IC. The states of the configuration memory cells also control the signal routing between the tiles via the programmable interconnection points 114. Depending on the type of programmable IC, a tile may include multi-gigabit transceivers, configurable logic blocks, random access memory blocks, input/output blocks, configuration and clocking logic, digital signal processing blocks, specialized input/output blocks (e.g., clock ports), and other programmable logic such as digital clock managers, analog-to-digital converters, and system monitoring logic.

Each programmable interconnection point includes a group of pass gates (e.g., FIG. 2), and the pass gates are programmably controlled for routing a signal. The embodiments use different pass gates at different times for routing a signal in order to increase the life expectancy of the programmable IC and allow for operating the programmable IC at a voltage level that is greater than the rated operating voltage level.

The storage device 104 is configured with multiple configuration bitstreams 122. The respective circuits implemented on the programmable IC when programmed with the configuration bitstreams are functionally equivalent. That is, for equivalent data at the primary inputs of circuits implemented on the programmable IC with the configuration bitstreams, data output from the primary outputs will be equivalent. The same input data will produce the same output data for circuits implemented with the different configuration bitstreams.

The configuration bitstreams 122 are different from one another in that no two of the configuration bitstreams program any of the same pass gates of the programmable IC. Thus, the respective subsets of pass gates of the programmable IC that are programmed by the configuration bitstreams are disjoint.

The control circuit 106 controls the configuring of the programmable IC with the different configuration bitstreams 122. Generally, the control circuit selects one of the configuration bitstreams and configures the programmable IC with that configuration bitstream. The control circuit then operates the programmable IC for a period of time. After expiration of the period of time, the control circuit selects another configuration bitstream and configures the programmable IC with the newly selected configuration bitstream'. The control circuit repeats the selecting, configuring, and operating of the programmable IC so that no one pass gate is used beyond the duration for which it is expected to be operate reliably.

In one embodiment, the control circuit implements a timer for limiting the time for which the programmable IC operates with each configuration bitstream. The timer may be configured to signal the need to change configuration bitstreams when the time operating with one configuration bitstream approaches the time limit for which the programmable IC is expected to operate reliably for a given operating voltage. In another embodiment, the time period may be reduced if the programmable IC is operated at a voltage level that is greater than the voltage level for which the programmable IC is rated.

In one embodiment, none of the configuration bitstreams is selected and used in the configuring of the programmable IC more than once. Alternatively, if the programmable IC is still in use after all the bitstreams have been used once, one or more of the configuration bitstreams may be reused. That is, the control circuit may select one of the bitstreams that has already been selected and used to configure the programmable IC. Once all the configuration bitstreams have been used once, the operating period may be reduced relative to the first round of configurations in order to reduce the risk of failure.

The structure of the storage device 104 and control circuit 106 may be chosen according to application requirements. A computer system having a processor and retentive storage (magnetic or electronic) may be suitable for some applications. Other applications may require hardwired circuitry for the control circuit and a read-only memory for the storage device.

Figure 2:
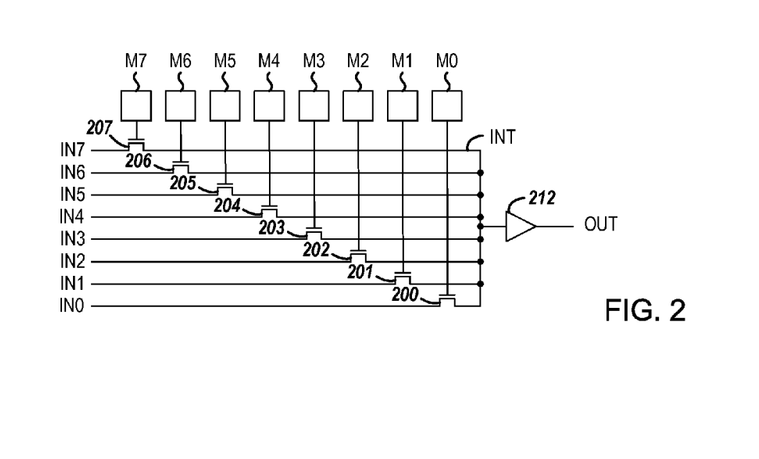
FIG. 2 shows an example group of pass gates of a programmable interconnect point.

FIG. 2 shows an example group of pass gates of a programmable interconnect point. The pass gates may be alternatively programmed in the different configuration bitstreams. The circuit of FIG. 2 includes eight input terminals IN0-IN7 and eight pass gates 200-207 that selectively pass one of signals IN0-IN7, respectively, to an internal node INT. The signal on internal node INT is buffered by buffer 212 to provide output signal OUT. Buffer 212, for example, can include two inverters coupled in series (not shown), and a pull up (e.g., a P-channel transistor to power high VDD, also not shown) on internal node INT and driven by the node between the two inverters. However, buffer 212 can be implemented in many different ways.

Each pass gate 200-207 has a gate terminal driven by one of memory cells M0-M7, respectively. Each memory cell can include two cross-coupled inverters (not shown). However, memory cell M0-M7 can also be implemented in many different ways. For example, configuration memory cells in FPGAs typically include configuration logic for loading the configuration data.

At most, one of memory cells M0-M7 can be configured with a high value at any given time. The one memory cell with a high value selects the associated input signal IN0-IN7 to be passed to internal node INT, and hence to output node OUT. If none of memory cells M0-M7 is configured with a high value, output signal OUT is held at its initial high value.

Since there are eight possible paths as controlled by the memory cells, the circuit of FIG. 2 would support an application in which eight configuration bitstreams use the eight different paths. Each configuration bitstream would implement a functionally equivalent circuit but program a different one of the memory cells M0-M7 to complete the path through one of the pass gates 200-207.

It will be appreciated that the embodiments of the invention are compatible with other more complex programmable interconnection points, such as that described in U.S. Pat. No. 6,798,270, which is incorporated by reference herein in its entirety.

Figure 3:
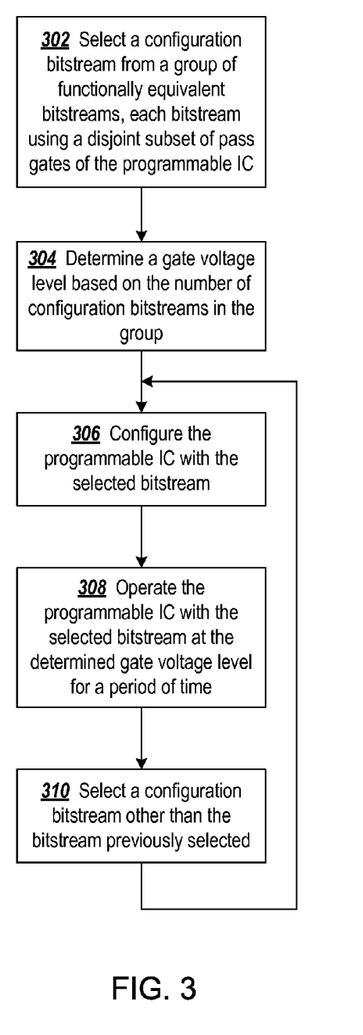
FIG. 3 is a flowchart of a process for operating a programmable IC programmed with functionally equivalent bitstreams.

FIG. 3 is a flowchart of a process for operating a programmable IC programmed with functionally equivalent bitstreams. At block 302, a configuration bitstream is selected from a group of configuration bitstreams. The circuit implemented on a programmable IC by each of the configuration bitstreams in the group is functionally equivalent to the circuits implemented by the others of the configuration bitstreams. The configuration bitstreams also program different subsets of the pass gates of the programmable IC. The respective subsets of pass gates are disjoint in order to avoid using any one pass gate beyond its expected reliability limit.

The number of configuration bitstreams depends on the number of alternative pass gates that are available on a particular path in the programmable IC. For example, if a node of the programmable IC implements a node of the circuit design, and there are four alternative pass gates directly connected to that node, then only four configuration bitstreams are needed.

At block 304, a gate voltage level is determined as a function of the number of configuration bitstreams in the group. The gate voltage can be increased as the number of configuration bitstreams increases. For example, four bitstreams for four alternative pass gates may allow Vdd to be increased by 15%, which may provide a 15% performance gain.

At block 306, the programmable IC is configured with the selected configuration bitstream, and at block 308, the programmable IC is operated at the determined gate voltage level for a period of time. In an alternative embodiment, the gate voltage is not adjusted based on the number of configuration bitstreams. Rather, the gate voltage is set according to the chip-makers specifications, and the life expectancy of the programmable IC may be increased simply by implementing the circuit with different pass gates.

In one embodiment, the periods of time the programmable IC is operated with each of the configuration bitstreams are equal. It will be appreciated that equal as used herein does not imply that the periods of time are exactly equal. Rather some small variations may be expected without unduly impacting the expected reliability of the programmable IC. At expiration of the period of time, the process proceeds to block 310 to select another configuration bitstream. The next configuration bitstream selected is one other than the previously selected configuration bitstream. The process then returns to block 306 to reconfigure the programmable IC and block 308 to operate the reconfigured programmable IC.

Figure 4:
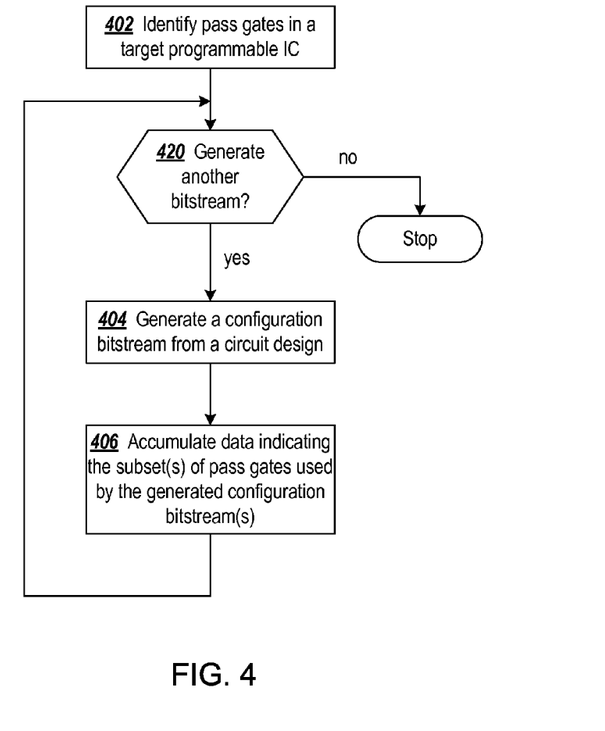
FIG. 4 is a flowchart of a process for generating functionally equivalent configuration bitstreams that use disjoint subsets of the pass gates of a programmable IC.

FIG. 4 is a flowchart of a process for generating functionally equivalent configuration bitstreams that use disjoint subsets of the pass gates of a programmable IC. At block 402, the pass gates of a target programmable IC are identified for purposes of tracking which pass gates are available to be used in each configuration bitstream.

At decision block 420, the process checks whether to continue generating configuration bitstreams. The decision may be based on a predetermined number of configuration bitstreams or based on some minimum number of pass gates expected to be necessary to successfully route a design. If another bitstream is to be generated, the process is directed to block 404, and another configuration bitstream is generated from the circuit design. The generating of each configuration bitstream may entail re-placing the components of the design and then routing signals of the design using the pass gates that have not been marked as used. The generated configuration bitstream is stored for later use in implementing the desired circuit.

At block 406, data are accumulated to indicate which pass gates were used in generating the configuration bitstream. The marked pass gates are then ineligible for use in generating a subsequent configuration bitstream. Once the desired number of configuration bitstreams has been generated, the process is complete.

Figure 5:
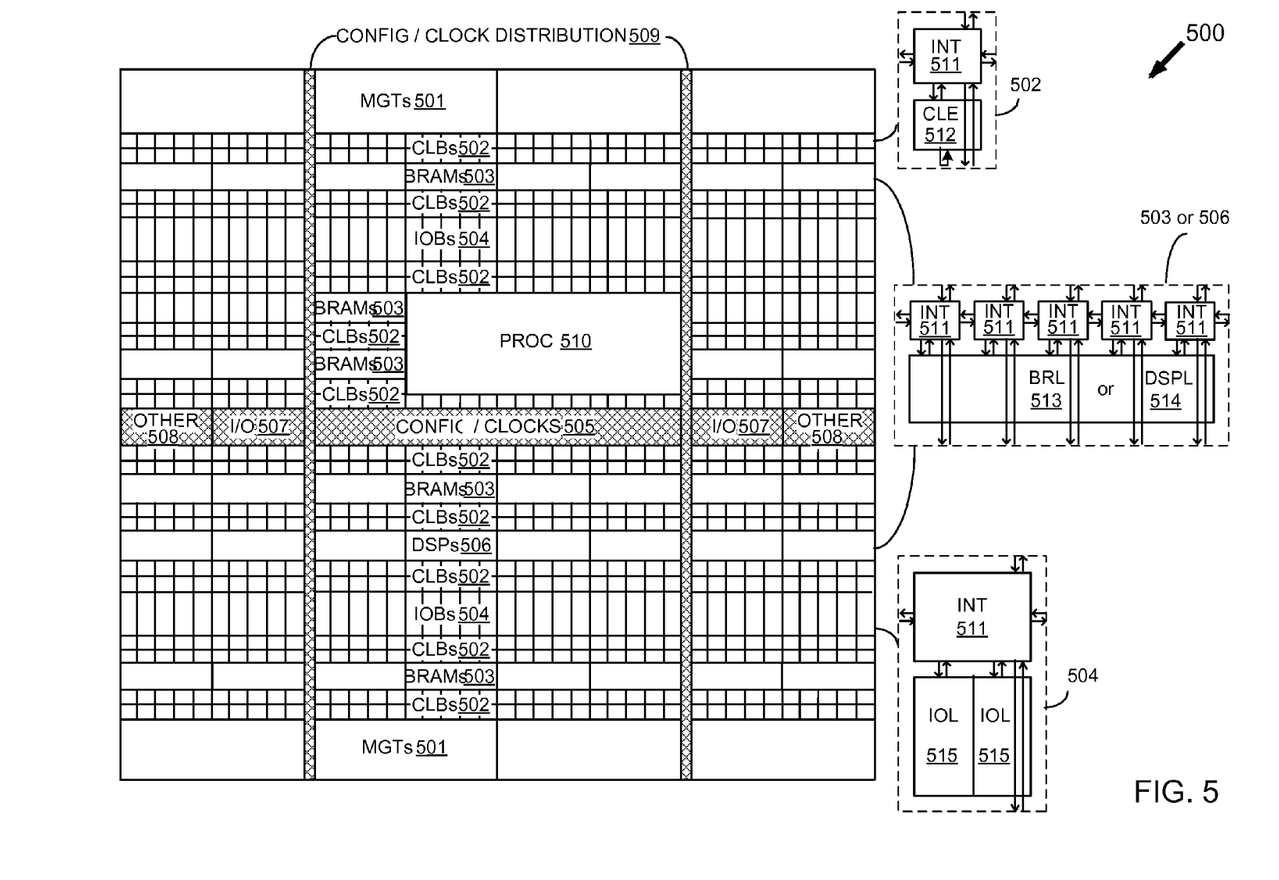
FIG. 5 is a block diagram of an example FPGA as a type of programmable logic IC that may be used in accordance with one or more embodiments of the invention.

FIG. 5 is a block diagram of an example FPGA as a type of programmable logic IC that may be used in accordance with one or more embodiments of the invention. FPGAs can include several different types of programmable logic blocks in the array. For example, FIG. 5 illustrates an FPGA architecture (500) that includes a large number of different programmable tiles including multi-gigabit transceivers (MGTs 501), configurable logic blocks (CLBs 502), random access memory blocks (BRAMs 503), input/output blocks (IOBs 504), configuration and clocking logic (CONFIG/CLOCKS 505), digital signal processing blocks (DSPs 506), specialized input/output blocks (I/O 507), for example, e.g., clock ports, and other programmable logic 508 such as digital clock managers, analog-to-digital converters, system monitoring logic, and so forth. Some FPGAs also include dedicated processor blocks (PROC 510) and internal and external reconfiguration ports (not shown).

In some FPGAs, each programmable tile includes a programmable interconnect element (INT 511) having standardized connections to and from a corresponding interconnect element in each adjacent tile. Therefore, the programmable interconnect elements taken together implement the programmable interconnect structure for the illustrated FPGA. The programmable interconnect element INT 511 also includes the connections to and from the programmable logic element within the same tile, as shown by the examples included at the top of FIG. 5.

For example, a CLB 502 can include a configurable logic element CLE 512 that can be programmed to implement user logic plus a single programmable interconnect element INT 511. A BRAM 503 can include a BRAM logic element (BRL 513) in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 506 can include a DSP logic element (DSPL 514) in addition to an appropriate number of programmable interconnect elements. An IOB 504 can include, for example, two instances of an input/output logic element (IOL 515) in addition to one instance of the programmable interconnect element INT 511. As will be clear to those of skill in the art, the actual I/O pads connected, for example, to the I/O logic element 515 are manufactured using metal layered above the various illustrated logic blocks, and typically are not confined to the area of the input/output logic element 515.

In the pictured embodiment, a columnar area near the center of the die (shown shaded in FIG. 5) is used for configuration, clock, and other control logic. Horizontal areas 509 extending from this column are used to distribute the clocks and configuration signals across the breadth of the FPGA.

Some FPGAs utilizing the architecture illustrated in FIG. 5 include additional logic blocks that disrupt the regular columnar structure making up a large part of the FPGA. The additional logic blocks can be programmable blocks and/or dedicated logic. For example, the processor block PROC 510 shown in FIG. 5 spans several columns of CLBs and BRAMs.

Note that FIG. 5 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 5 are purely exemplary. For example, in an actual FPGA more than one adjacent column of CLBs is typically included wherever the CLBs appear, to facilitate the efficient implementation of user logic.

It will be appreciated that various alternative computing arrangements, including one or more processors and a memory arrangement configured with program code, would be suitable for hosting the processes and data structures and implementing the algorithms of the different embodiments. The computer code, comprising the processes of one or more embodiments encoded in a processor executable format, may be stored and provided via a variety of computer-readable storage media or delivery channels such as magnetic or optical disks or tapes, electronic storage devices, or as application services over a network.

Figure 6:
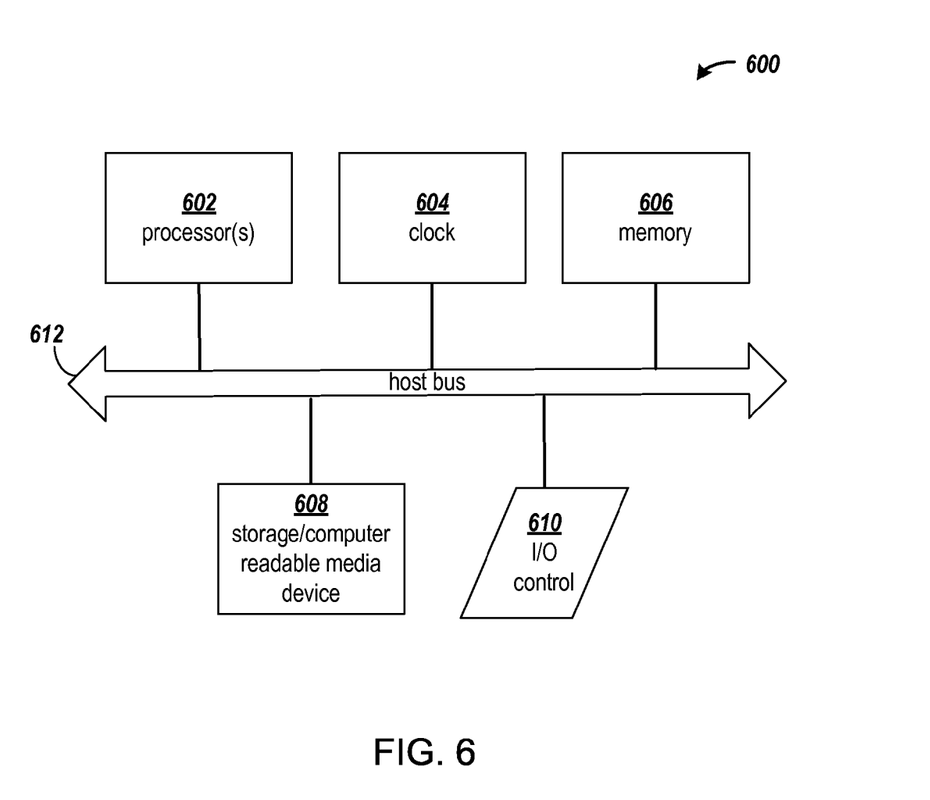
FIG. 6 shows a block diagram of an example computing arrangement that may be configured to implement the one or more of the processes described herein.

FIG. 6 shows a block diagram of an example computing arrangement that may be configured to implement the one or more of the processes described herein. It will be appreciated that various alternative computing arrangements, including one or more processors and a memory arrangement configured with program code, would be suitable for hosting the processes and data structures and implementing the algorithms of the different embodiments. The computer code, comprising the processes of one or more embodiments encoded in a processor executable format, may be stored and provided via a variety of computer-readable storage media or delivery channels such as magnetic or optical disks or tapes, electronic storage devices, or as application services over a network.

Processor computing arrangement 600 includes one or more processors 602, a clock signal generator 604, a memory unit 606, a storage unit 608, and an input/output control unit 610, all coupled to a host bus 612. The arrangement 600 may be implemented with separate components on a circuit board or may be implemented internally within an integrated circuit. When implemented internally within an integrated circuit, the processor computing arrangement is otherwise known as a microcontroller.

The architecture of the computing arrangement depends on implementation requirements as would be recognized by those skilled in the art. The processor 602 may be one or more general purpose processors, or a combination of one or more general purpose processors and suitable co-processors, or one or more specialized processors (e.g., RISC, CISC, pipelined, etc.).

The memory arrangement 606 typically includes multiple levels of cache memory, and a main memory. The storage arrangement 608 may include local and/or remote persistent storage, such as provided by magnetic disks (not shown), flash, EPROM, or other non-volatile data storage. The storage unit may be read or read/write capable. Further, the memory 606 and storage 608 may be combined in a single arrangement.

The processor arrangement 602 executes the software in storage 608 and/or memory 606, reads data from and stores data to the storage 608 and/or memory 606, and communicates with external devices through the input/output control arrangement 610. These functions are synchronized by the clock signal generator 604. The resource of the computing arrangement may be managed by either an operating system (not shown), or a hardware control unit (not shown).

The embodiments are thought to be applicable to a variety of systems for implementing circuit designs. Other aspects and embodiments will be apparent to those skilled in the art from consideration of the specification. The embodiments may be implemented as one or more processors configured to execute software, as an application specific integrated circuit (ASIC), or as a logic on a programmable logic device. It is intended that the specification and illustrated embodiments be considered as examples only, with a true scope of the invention being indicated by the following claims.

What is claimed is:

1. A method of operating a programmable integrated circuit (IC), comprising:
   selecting one configuration bitstream of two or more configuration bitstreams, wherein each configuration bitstream implements a functionally equivalent circuit on the programmable IC and programs a respective subset of pass gates of the programmable IC, and each subset of pass gates is disjoint from each other subset of pass gates;
   configuring the programmable IC with the one configuration bitstream, wherein the programmable IC is defect-free;
   operating the defect-free programmable IC configured with the one configuration bitstream for a period of time; and
   repeating the selecting, configuring, and operating, wherein for successive selecting operations, different ones of the configuration bitstreams are selected.

2. The method of claim 1, wherein for a plurality of the selecting operations, one or more of the configuration bitstreams are selected and used in the configuring of the programmable IC more than once.

3. The method of claim 1, wherein for a plurality of the selecting operations, none of the configuration bitstreams is selected and used in the configuring of the programmable IC more than once.

4. The method of claim 1, wherein:
   the programmable IC includes programmable logic and programmable interconnect for inter-coupling the programmable logic;
   the programmable interconnect includes the pass gates; and
   the operating the defect-free programmable IC includes transmitting signals between programmable logic via the pass gates of the programmable interconnect.

5. The method of claim 1, further comprising determining a gate voltage level as a function of a count of the configuration bitstreams.

6. The method of claim 5, further comprising setting the gate voltage level of the programmable IC with the determined gate voltage level.

7. The method of claim 1, wherein:
   the pass gates of the programmable IC are rated to have a reliability period when operated at a given gate voltage level; and
   the operating of the programmable IC includes operating the programmable IC with the one configuration bitstream for the reliability period at the given gate voltage level.

8. The method of claim 1, wherein the periods of time the defect-free programmable IC is operated with each of the two or more configuration bitstreams are equal.

9. The method of claim 1, wherein a count of the two or more configuration bitstreams is less than or equal to a count of alternative pass gates.

10. A system, comprising:
    a defect-free programmable integrated circuit (IC) having a configuration port and a plurality of pass gates;
    a storage device coupled to the configuration port of the programmable IC and configured with two or more configuration bitstreams, wherein each configuration bitstream implements a functionally equivalent circuit on the programmable IC and programs a respective subset of the pass gates, and each subset of pass gates is disjoint from each other subset of pass gates; and a control circuit coupled to the storage device and to the programmable IC, the control circuit configured and arranged to perform operations including:
selecting one of the two or more configuration bitstreams;
configuring the programmable IC with the one configuration bitstream;
operating the defect-free programmable IC configured with the one configuration bitstream for a period of time; and
repeating the selecting, configuring and operating, wherein for successive selecting operations, different ones of the configuration bitstreams are selected.

11. The system of claim 10, wherein for a plurality of the selecting operations, one or more of the configuration bitstreams are selected and used in the configuring of the programmable IC more than once.

12. The system of claim 10, wherein for a plurality of the selecting operations, none of the configuration bitstreams is selected and used in the configuring of the programmable IC more than once.

13. The system of claim 10, wherein:
the programmable IC includes programmable logic and programmable interconnect for inter-coupling the programmable logic;
the programmable interconnect includes the pass gates; and
the operating the defect-free programmable IC includes transmitting signals between programmable logic via the pass gates of the programmable interconnect.

14. The system of claim 10, further comprising:
wherein the pass gates of the programmable IC are rated to have a reliability period when operated at a given gate voltage level; and
the operating of the programmable IC includes operating the programmable IC with the one configuration bitstream for the reliability period at a voltage level greater than the given gate voltage level.

15. The system of claim 14, wherein for a plurality of the selecting operations, none of the configuration bitstreams is selected and used in the configuring of the programmable IC more than once.

16. The system of claim 10, wherein:
the pass gates of the programmable IC are rated to have a reliability period when operated at a given gate voltage level; and
the operating of the programmable IC includes operating the programmable IC with the one configuration bitstream for the reliability period at the given gate voltage level.

17. The system of claim 16, wherein for a plurality of the selecting operations, none of the configuration bitstreams is selected and used in the configuring of the programmable IC more than once.

18. The system of claim 11, wherein the periods of time the defect-free programmable IC is operated with each of the two or more configuration bitstreams are equal.

19. The system of claim 18, wherein a count of the two or more configuration bitstreams is less than or equal to a count of alternative pass gates.

* * * * *